(12) United States Patent
Chiu

(10) Patent No.: US 10,614,864 B1
(45) Date of Patent: Apr. 7, 2020

(54) BUFFER OUTPUT CIRCUIT, DRIVING METHOD THEREOF AND MEMORY APPARATUS

(71) Applicant: Winbond Electronics Corp., Taichung (TW)

(72) Inventor: Liang-Shiang Chiu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/409,870

(22) Filed: May 13, 2019

(51) Int. Cl.
| | |
|---|---|
| *H03K 19/06* | (2006.01) |
| *H03K 19/00* | (2006.01) |
| *G11C 7/10* | (2006.01) |
| *H03K 17/687* | (2006.01) |
| *G11C 7/04* | (2006.01) |

(Continued)

(52) U.S. Cl.
CPC ............ *G11C 7/1057* (2013.01); *G11C 7/04* (2013.01); *H03K 17/6871* (2013.01); *H03K 17/6872* (2013.01); *H03K 19/0013* (2013.01); *H03K 19/017* (2013.01); *H03K 19/01728* (2013.01); *H03K 19/01855* (2013.01); *H03K 19/096* (2013.01)

(58) Field of Classification Search
CPC .... G11C 7/1057; G11C 7/04; H03K 19/0013; H03K 17/6872; H03K 19/00361; H03K 19/00315; H03K 19/00384; H03K 19/018571; H03K 17/223; H03K 17/6871; H03K 19/0008; H03K 19/018521; H03K 19/0948; H03K 19/017
See application file for complete search history.

(56) References Cited

U.S. PATENT DOCUMENTS

| | | | | |
|---|---|---|---|---|
| 4,638,187 A | * | 1/1987 | Boler | ................. H03K 19/0013 326/17 |
| 4,820,942 A | | 4/1989 | Chan | |

(Continued)

FOREIGN PATENT DOCUMENTS

| | | |
|---|---|---|
| CN | 102024410 | 4/2011 |
| TW | 380309 | 1/2000 |

(Continued)

OTHER PUBLICATIONS

"Office Action of Taiwan Counterpart Application", dated Nov. 26 , 2019, pp. 1-9.

*Primary Examiner* — Vibol Tan
(74) *Attorney, Agent, or Firm* — JCIPRNET

(57) ABSTRACT

A buffer output circuit, a driving method thereof and a memory apparatus are provided. The memory apparatus includes a memory array and the buffer output circuit including a first output stage circuit and a second output stage circuit. The first output stage circuit and the second output stage circuit receive the data signal at the same time and are both coupled to the data output terminal outputting a data output signal. The second output stage circuit receives a feedback signal from the first output stage circuit. During a pre-charging-discharging period, the first output stage circuit performs a voltage pre-raising operation or a voltage pre-decreasing operation on the data output signal based on the data signal, and the second output stage circuit keeps the level of the data output signal changing based on the feedback signal until the state transition of the data output signal is completed.

17 Claims, 5 Drawing Sheets

(51) Int. Cl.
*H03K 19/017* (2006.01)
*H03K 19/0185* (2006.01)
*H03K 19/096* (2006.01)

(56) References Cited

U.S. PATENT DOCUMENTS

| | | | |
|---|---|---|---|
| 5,124,579 A * | 6/1992 | Naghshineh | H03K 19/00361 326/27 |
| 5,387,824 A * | 2/1995 | Michelsen | G11C 7/1051 326/21 |
| 5,831,458 A * | 11/1998 | Nakagawa | H03K 19/09429 327/108 |
| 6,225,824 B1 | 5/2001 | Madhu et al. | |
| 6,445,212 B1 * | 9/2002 | Wey | H03K 17/164 326/26 |
| 7,449,913 B1 | 11/2008 | Hung | |
| 7,786,761 B2 | 8/2010 | Lin | |
| 7,834,663 B2 * | 11/2010 | Wendell | H03K 3/35613 326/104 |
| 7,872,516 B2 * | 1/2011 | Masleid | H03K 3/011 327/166 |
| 7,986,165 B1 * | 7/2011 | Lin | H03K 19/01728 326/63 |
| 9,376,966 B2 | 6/2016 | Rabhi | |
| 9,685,944 B1 * | 6/2017 | Seshita | H03K 17/223 |
| 2009/0167370 A1 | 7/2009 | Bartolini et al. | |

FOREIGN PATENT DOCUMENTS

| | | |
|---|---|---|
| TW | 425763 | 3/2001 |
| TW | I224260 | 11/2004 |
| TW | I283514 | 7/2007 |

* cited by examiner

BUFFER OUTPUT CIRCUIT, DRIVING METHOD THEREOF AND MEMORY APPARATUS

BACKGROUND OF THE INVENTION

1. Field of the Invention

The present invention relates to a buffer circuit, and in particular to a buffer output circuit, a driving method thereof and a memory apparatus.

2. Description of Related Art

An existing buffer output apparatus usually utilizes switching devices to switch between high and low reference voltages, but the switching devices may have reaction times. For example, in a switching device implemented by a transistor, the voltage at the control terminal needs to exceed the threshold voltage to start to conduct gradually. When the state transition of an output signal is required, the switching device which provides the high reference voltage and the switching device which provides the low reference voltage may be completely or partially switched on at the same time to cause non-negligible short-circuit current. The short-circuit current may increase circuit power consumption and abnormality of the output signal. For example, a current bounce noise occurs at a high reference voltage or a low reference voltage. Therefore, how to suppress short-circuit current is a very important subject.

SUMMARY OF THE INVENTION

The present invention provides a buffer output circuit, a driving method thereof and a memory apparatus, which can combine the advantages of reducing bounce noise between high and low voltage levels and having high-speed output.

The buffer output circuit of the present invention receives a data signal to output a data output signal at a data output terminal, and includes a first output stage circuit and a second output stage circuit. The second output stage circuit is coupled to the first output stage circuit to receive a feedback signal, wherein the first output stage circuit and the second output stage circuit receive the data signal at the same time and are both coupled to the data output terminal. During a pre-charging-discharging period, the first output stage circuit performs a voltage pre-raising operation or a voltage pre-decreasing operation on the data output signal based on the data signal, and after the pre-charging-discharging period is over, the second output stage circuit keeps the level of the data output signal changing based on the feedback signal until the state transition of the data output signal is completed.

An embodiment of the present invention provides a memory apparatus which includes a memory array and the foregoing buffer output circuit, wherein at least one buffer output circuit is coupled to the memory array.

An embodiment of the present invention provides a driving method of a buffer output circuit, wherein the buffer output circuit receives a data signal to output a data output signal at a data output terminal, and the driving method includes: during a pre-charging-discharging period, performing a voltage pre-raising operation or a voltage pre-decreasing operation on the data output signal based on the data signal and generating a feedback signal; and after the pre-charging-discharging period is over, keeping the level of the data output signal changing based on the feedback signal until the state transition of the data output signal is completed.

Based on the foregoing, by the buffer output circuit, the driving method thereof and the memory apparatus in the present invention, the voltage level of the data output signal may be pre-changed through the first output stage circuit during the pre-charging-discharging period, and the data output signal is switched to another logic level through the second output stage circuit based on the feedback signal after the pre-charging-discharging period. Therefore, the effect of reducing short-circuit current and potential bounce noise is achieved.

In order to make the aforementioned and other objectives and advantages of the present invention comprehensible, embodiments accompanied with figures are described in detail below.

DESCRIPTION OF THE EMBODIMENTS

It is to be understood that other embodiments may be utilized and structural changes may be made without departing from the scope of the present invention. Also, it is to be understood that the phraseology and terminology used herein are for the purpose of description and should not be regarded as limiting. The use of "comprising/including" or "having" and variations thereof herein, is meant to encompass the items listed thereafter and equivalents thereof as well as additional items. Unless limited otherwise, the terms "connected" and "coupled" and variations thereof herein are used broadly and encompass both direct and indirect connections and couplings.

Figure 1:
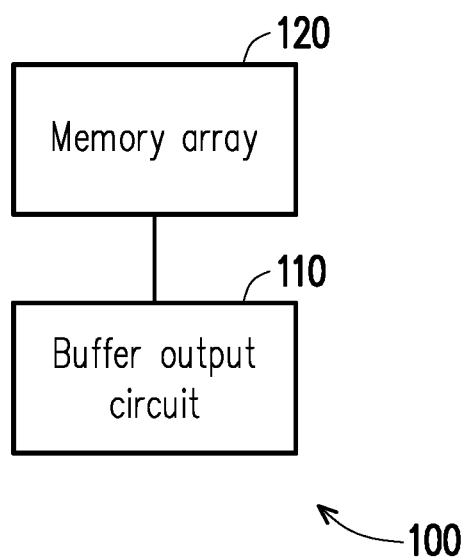
FIG. 1 is a block diagram of a memory apparatus according to an embodiment of the present invention.

FIG. 1 is a block diagram of a memory apparatus according to an embodiment of the present invention. Referring to FIG. 1, a memory apparatus 100 includes a buffer output circuit 110 and a memory array 120, and the buffer output circuit 110 is coupled to the memory array 120. The memory array 120 includes a plurality of memory cells arranged in a matrix and a plurality of bit lines which are electrically connected with the memory cells. By the bit lines, the buffer output circuit 110 can maintain data which are about to be written to the memory cells or read from the memory cells.

Figure 2:
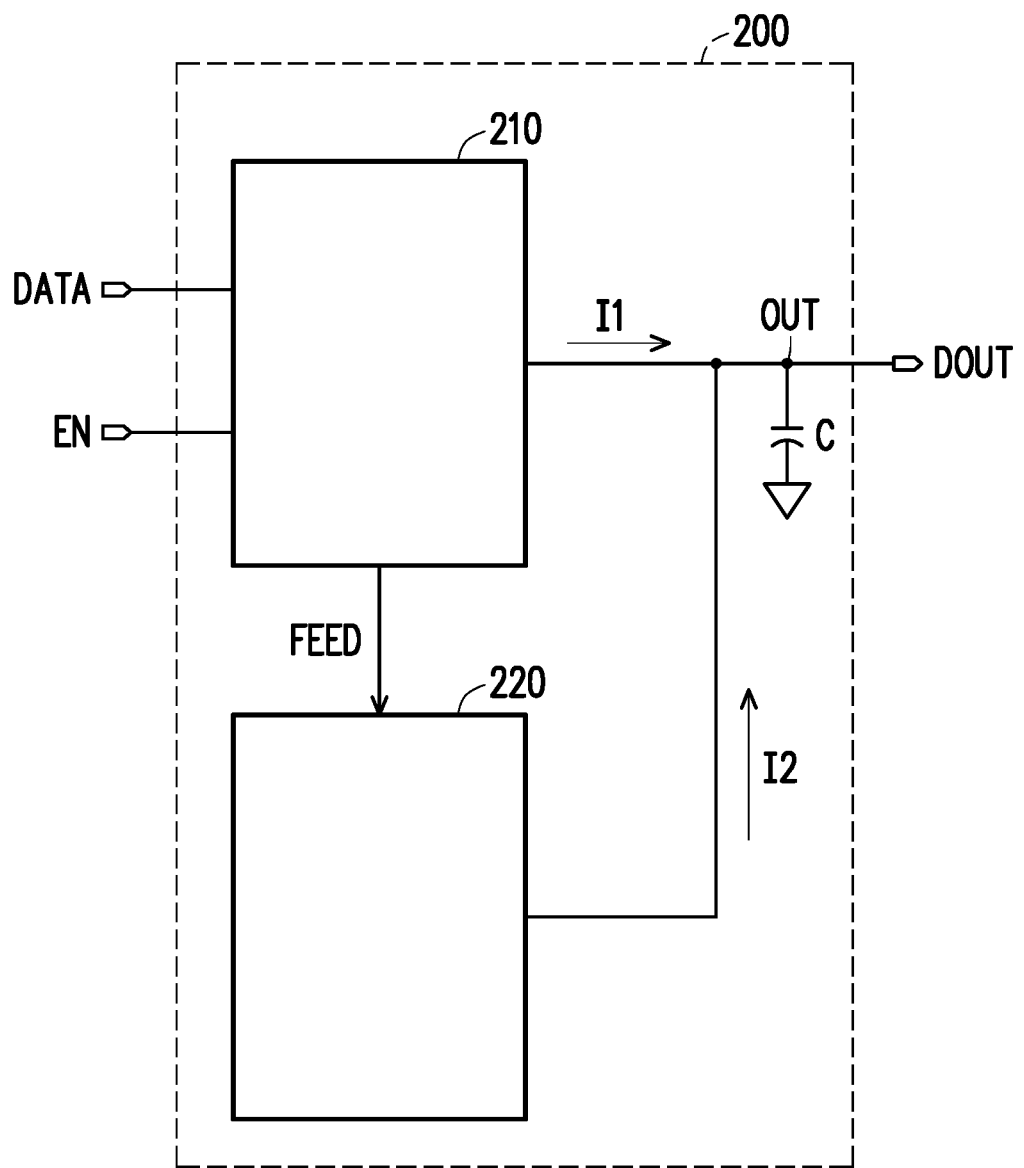
FIG. 2 is a diagram of the architecture of a buffer output circuit according to an embodiment of the present invention.

FIG. 2 is a diagram of the architecture of a buffer output circuit according to an embodiment of the present invention. The buffer output circuit 110 of FIG. 1 can be a buffer output circuit 200 of FIG. 2. Referring to FIG. 2, the buffer output circuit 200 receives a data signal DATA and is provided with a data output terminal OUT. The buffer output circuit 200 may output a data output signal DOUT at the data output terminal OUT according to a data signal DATA. The buffer output circuit 200 at least includes a first output stage circuit 210 and a second output stage circuit 220. In the present embodiment, the buffer output circuit 200 may further include a load capacitor C. The data output terminal OUT is coupled to the load capacitor C, and another end of the load capacitor C is grounded. The first output stage circuit 210 and the second output stage circuit 220 receive the data signal DATA at the same time, moreover, an output end of the first output stage circuit 210 and an output end of the second output stage circuit 220 are both coupled to the data output terminal OUT to change the state of the data output signal DOUT according to the data signal DATA. The first output stage circuit 210 may be coupled to the second output stage circuit 220 and provides a feedback signal FEED to the second output stage circuit 220.

Herein, a state transition of the data output signal DOUT means change of the logic level of the data output signal DOUT, for example, the level of the data output signal is switched to a second level from a first level or is switched to the first level from the second level.

In a state transition process of the data output signal DOUT, for example, when the level of the data output signal DOUT is switched to the second level from the first level, the first output stage circuit 210 may perform a voltage pre-raising operation or a voltage pre-decreasing operation on the data output signal DOUT during a pre-charging-discharging period for gradually changing the voltage level of the data output signal DOUT. After the pre-charging-discharging period is over, the level of the data output signal DOUT has not been changed to the second level yet at the moment, the second output stage circuit 220 may keep the voltage level of the data output signal DOUT changing based on the feedback signal FEED, so that the voltage level of the data output signal DOUT is changed to the second level for completing the state transition.

In the present embodiment, the size of at least one transistor of the first output stage circuit 210 may be different from the size of at least one transistor of the second output stage circuit 220. During the pre-charging-discharging period, at least one transistor of the first output stage circuit 210 is switched on for providing a first current I1 to the data output terminal OUT, and after the pre-charging-discharging period is over, at least one transistor of the second output stage circuit 210 is switched on based on the feed signal FEED for providing a second current I2 to the data output terminal OUT.

Specifically, the size of the at least one transistor which is switched on in the first output stage circuit 210 is different from the size of the at least one transistor which is switched on in the second output stage circuit 220, so that the first current I1 and the second current I2 which have different magnitudes are provided, wherein the second current I2 may be greater than the first current I1. In addition, comparing with the clock cycle of the data output signal DOUT, the pre-charging-discharging period is quite short.

Figure 3:
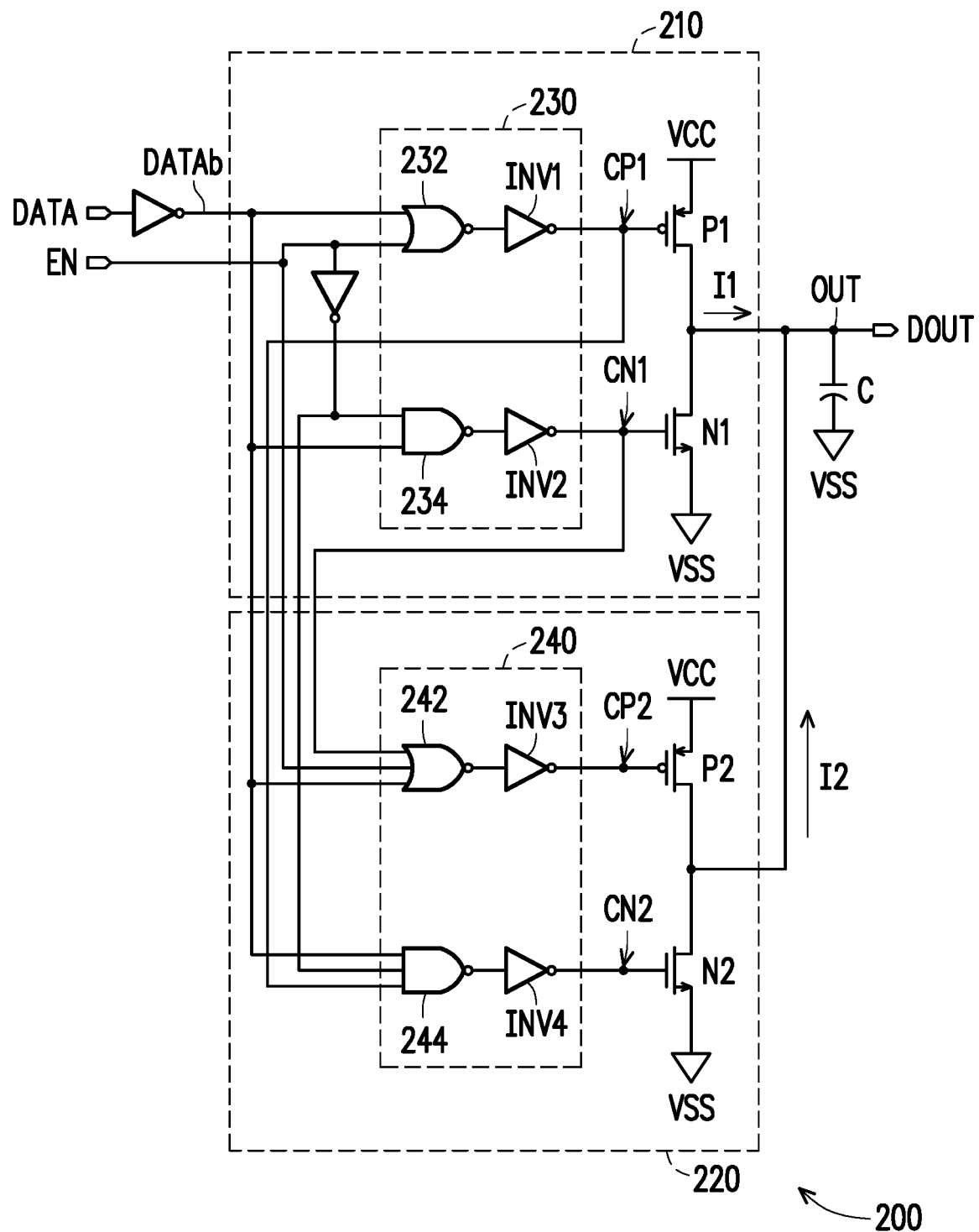
FIG. 3 is a circuit diagram of the buffer output circuit according to an embodiment of the present invention.

FIG. 3 is a circuit diagram of the buffer output circuit according to an embodiment of the present invention. The details of the implementation of the buffer output circuit 200 will be further illustrated in an embodiment of FIG. 3 below.

The first output stage circuit 210 may include a first logic circuit 230, a first transistor P1 and a second transistor N1. The first logic circuit 230 may output a first control signal CP1 and a second control signal CN1 according to the data signal DATA, and the first control signal CP1 and the second control signal CN1 are respectively used for controlling switch-on or switch-off of the first transistor P1 and switch-on or switch off of the second transistor N1, and moreover, the first control signal CP1 and the second control signal CN1 may serve as the feed signal FEED which are provided to the second logic circuit 240.

The second output stage circuit 220 includes a second logic circuit 240, a third transistor P2 and a fourth transistor N2. The second logic circuit 240 may be coupled to the first logic circuit 230 to receive the feedback signal FEED, and output a third control signal CP2 and a fourth control signal CN2 according to the data signal DATA and the feedback signal FEED. The third control signal CP2 and the fourth control signal CN2 are respectively used for controlling switch-on or switch-off of the third transistor P2 and switch-on or switch-off of the fourth transistor N2.

In the present embodiment, one of the first transistor P1 and the second transistor N1 is a P-type transistor while the other of the first transistor P1 and the second transistor N1 is an N-type transistor, and one of the third transistor P2 and the fourth transistor N2 is a P-type transistor while the other of the third transistor P2 and the fourth transistor N2 is an N-type transistor. The sizes of the transistors with the same type in the first transistor P1, the second transistor N1, the third transistor P2 and the fourth transistor N2 may be different. In an embodiment, for the transistors with the same type, the sizes of the transistors which belong to the first output stage circuit 210 may be smaller than the sizes of the transistors which belong to the second output stage circuit 220.

For example, the first transistor P1 is a P-type transistor, the second transistor N1 is an N-type transistor, the third transistor P2 is a P-type transistor, the fourth transistor N2 is an N-type transistor, but they are not limited to this. The size of the first transistor P1 as the P-type transistor may be smaller than the size of the third transistor P2 also as the P-type transistor, and the size of the second transistor N1 as the N-type transistor may be smaller than the size of the fourth transistor N2 also as the N-type transistor. For example, the channel width of the first transistor P1 is smaller than the channel width of the third transistor P2, and the channel width of the second transistor N1 is smaller than the channel width of the fourth transistor N2. The load capacitance which is equal to 10 pF is taken as an example, wherein a ratio of the channel width of the first transistor P1 to the channel width of the third transistor P2 may be in a range of ¼ to ⅓, and a ratio of the channel width of the second transistor N1 to the channel width of the fourth transistor N2 may be in a range of ¼ to ⅓.

In an embodiment, the channel length of the first transistor P1 is the same as the channel length of the third transistor P2, but the ratio of the channel width of the first transistor P1 to the channel width of the third transistor P2 is 1:3. Similarly, the channel length of the second transistor N1 is the same as the channel length of the fourth transistor N2, but the ratio of the channel width of the second transistor N1 to the channel width of the fourth transistor N2 is also 1:3.

In addition, in an embodiment, the ratio of the size of the first transistor P1 or the second transistor N1 of the first output stage circuit 210 to the size of the third transistor P2 or the fourth transistor N2 of the second output stage circuit 220 may be decided according to the capacitance of the load capacitor C.

In the embodiment of FIG. 3, a first end (which is a source terminal herein) of the first transistor P1 receives a first reference voltage VCC, a second end (which is a drain terminal herein) of the first transistor P1 is coupled to the data output terminal OUT, and a gate terminal of the first transistor P1 is coupled to the first logic circuit 230 to receive the first control signal CP1. A first end (which is a drain terminal herein) of the second transistor N1 is coupled to the data output terminal OUT, a second end (which is a source terminal herein) of the second transistor N1 receives a second reference voltage VSS, and a gate terminal of the second transistor N1 is coupled to the first logic circuit 230 to receive the second control signal CN1. In the present embodiment, the first reference voltage VCC is a system high voltage such as a power voltage, and the second reference voltage VSS is a system low voltage such as a ground voltage.

A first end (which is a source terminal herein) of the third transistor P2 receives the first reference voltage VCC, a second end (which is a drain terminal herein) of the third transistor P2 is coupled to the data output terminal OUT, and a gate terminal of the third transistor P2 is coupled to the second logic circuit 240 to receive the third control signal CP2. A first end (which is a drain terminal herein) of the fourth transistor N2 is coupled to the data output terminal OUT, a second end (which is a source terminal herein) of the fourth transistor N2 receives the second reference voltage VSS, and a gate terminal of the fourth transistor N2 is coupled to the second logic circuit 240 to receive the fourth control signal CN2.

During the pre-charging-discharging period, one of the first transistor P1 and the second transistor N1 is gradually switched on and the other of the first transistor P1 and the second transistor N1 is gradually switched off, and one of the third transistor P2 and the fourth transistor N2 is gradually switched off and the other of the third transistor P2 and the fourth transistor N2 keeps unchanged. After the pre-charging-discharging period is over, the other of the third transistor P2 and the fourth transistor N2 begins to be switched on.

In detail, the first logic circuit 230 in FIG. 3 includes a first NOR gate 232, a first NAND gate 234, a first inverter INV1 and a second inverter INV2. The first NOR gate 232 is connected with the first phase inverter INV1 in series, the output of the first NOR gate 232 is used for controlling the first transistor P1, the first NAND gate 234 is connected with the second phase inverter INV2 in series, and the output of the first NAND gate 234 is used for controlling the second transistor N1.

One of input ends of the first NOR gate 232 receives an inversion signal (hereinafter referred to as an inversion data signal DATAb) of the data signal DATA while the other input end receives an enable signal EN, and an output end of the first NOR gate 232 is coupled to an input end of the first inverter INV1. An output end of the first inverter INV1 is coupled to the gate terminal of the first transistor P1, and provides the first control signal CP1. One of input ends of the first NAND gate 234 also receives the inversion data signal DATAb while the other input end receives the inversion signal of the enable signal EN, and an output end of the first NAND gate 234 is coupled to an input end of the second inverter INV2. An output end of the second inverter INV2 is coupled to the gate terminal of the second transistor N1, and provides the second control signal CN1.

The second logic circuit 240 in FIG. 3 includes a second NOR gate 242, a second NAND gate 244, a third inverter INV3 and a fourth inverter INV4. The second NOR gate 242 is connected with the third inverter INV3 in series, the output of the second NOR gate 242 is used for controlling the third transistor P2. The second NAND gate 244 is connected with the fourth inverter INV4 in series, and the output of the second NAND gate 244 is used for controlling the fourth transistor N2.

The second NOR gate 242 receives the inversion data signal DATAb, the enable signal EN and the second control signal CN1, and an output end of the second NOR gate 242 is coupled to an input end of the third inverter INV3. An output end of the third inverter INV3 is coupled to the gate terminal of the third transistor P2, and provides the third control signal CP2. The second NAND gate 244 receives the inversion data signal DATAb, the inversion signal of the enable signal EN and the first control signal CP1, and an output end of the second NAND gate 244 is coupled to an input end of the fourth inverter INV4. An output end of the fourth inverter INV4 is coupled to the gate terminal of the fourth transistor N2, and provides the fourth control signal CN2.

Figure 4:
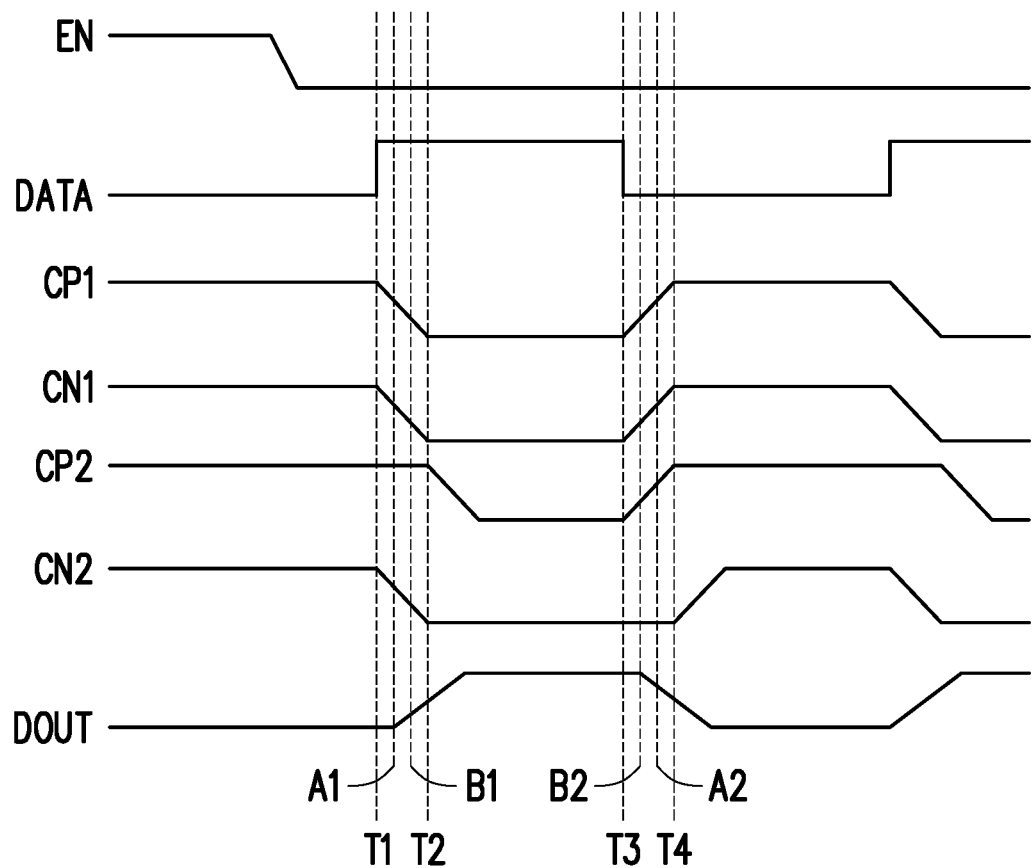
FIG. 4 is a waveform diagram of the signals used in the buffer output circuit according to an embodiment of the present invention.

FIG. 4 is a waveform diagram of the signals used in buffer output circuit according to an embodiment of the present invention. Referring to FIG. 4 in combination with FIG. 3, in the present embodiment, when the level of the enable signal EN is at a low level, it represents that enable, when the level of the enable signal EN is at a high level, it means disable, which is not limited by the invention. For example, in the following statement, for example, the first level is a logic low level (LOW), and the second level is a logic high level (HIGH), but they are not limited to this.

During an enable period (when the level of the enable signal EN is at the low level), at a time point T1, the level of the data signal DATA transits to the second level from the first level. At the moment, the first transistor P1 and the third transistor P2 are both in a switch-off state, and the second transistor N1 and the fourth transistor N2 are both in a switch-on state. The level of the first control signal CP1 begins to fall gradually from the second level so as to switch on the first transistor P1, and meanwhile, the second control signal CN1 also begins to fall gradually from the second level so as to switch off the second transistor N1. In addition, the fourth control signal CN2 also begins to fall gradually from the second level so as to switch off the fourth transistor N2. The third control signal CP2 keeps unchanged temporarily.

At the time point A1, the first transistor P1 begins to be switched on, and at a time point B1, the second transistor N1 is switched off. After the time point A1, the first transistor P1 begins to be switched on, and the potential of the data output terminal OUT is affected by the first reference voltage VCC and then begins to raise gradually. During a period from the time point A1 to the time point B1, the second transistor N1 has not been switched off yet, and the first transistor P1 and the second transistor N1 are switched on at the same time to cause short through current. But due to the size design of the first transistor P1 and the second transistor N1, the current value of the short-circuit current of the first output stage circuit 210 may be suppressed, and abnormality of the output of the data output terminal OUT is avoided.

Then, at a time point T2, the levels of the first control signal CP1, the second control signal CN1 and the fourth control signal CN2 have been switched to the first level, the first transistor P1 is switched on completely, and the second transistor N1 and the fourth transistor N2 are switched off completely. It needs to be noted that before the time point T2, the third control signal CP2 on the gate terminal of the third transistor P2 keeps unchanged substantially, and the third transistor P2 is still in a switch-off state.

A switching period of the first transistor P1 and the second transistor N1 in the first output stage circuit 210 is referred to as the pre-charging-discharging period herein. For example, a period from the time point T1 to the time point T2 is the pre-charging-discharging period herein.

During the pre-charging-discharging period, the first transistor P1 begins to be switched on, the voltage level of the data output signal DOUT is pulled up by the first reference voltage VCC, and the first output stage circuit 210 provides the first current I1 for the data output terminal OUT. Due to limitation to the size of the first transistor P1, the current value of the first current I1 is not too high, thus, during the pre-charging-discharging period, the level of the data output signal DOUT is not switched to the second level from the first level, but has raised gradually, and the process is referred to as a voltage pre-raising operation herein.

After the pre-charging-discharging period (after the time point T2), the level of the third control signal CP2 begins to be switched to the first level from the second level for switching on the third transistor P2 according to the feedback signal FEED (which is the second control signal CN1 more accurately). After the third transistor P2 is switched on, the second output stage circuit 220 provides the higher second current I2 to the data output terminal OUT, and the voltage level of the data output signal DOUT keeps being pulled up by the first reference voltage VCC and then is changed to the second level.

Specifically, although the second current I2 is greater than the first current I1, the third transistor P2 is switched on after the fourth transistor N2 is switched off, therefore, the third transistor P2 and the fourth transistor N2 cannot be switched on at the same time, and short-circuit current cannot occur.

Similarly, at a time point T3, the level of the data signal DATA requires to be transited to the first level from the second level, at the moment, the first transistor P1 and the third transistor P2 are both in a switch-on state, and the second transistor N1 and the fourth transistor N2 are in a switch-off state.

During the pre-charging-discharging period (namely the period from the time point T3 to a time point T4), the level of the first control signal CP1 begins to raise gradually from the first level so as to switch off the first transistor P1, meanwhile, the level of the second control signal CN1 also begins to raise gradually from the first level so as to switch on the second transistor N1, and moreover, the level of the third control signal CP2 also begins to raise gradually from the first level so as to switch off the third transistor P2. The fourth control signal CN2 keeps unchanged temporarily. At the time point T4, the level of data output signal DOUT may not be switched to the first level yet, but has fallen gradually from the second level, and the process is referred to as a voltage pre-decreasing operation herein.

At a time point A2, the first transistor P1 is switched off, and at a time point B2, the second transistor N1 begins to be switched on. After the time point B2, because the second transistor N1 begins to be switched on, the voltage level of the data output signal DOUT is pulled down by the second reference voltage VSS, and the first output stage circuit 210 provides the first current I1 for the data output terminal OUT to perform the voltage pre-decreasing operation. In a period from the time point B2 to the time point A2, the first transistor P1 and the second transistor N1 may be switched on at the same time to cause short through current, but the magnitude of the short-circuit current may be limited by the size design of the first transistor P1 and the second transistor N1. Therefore, output disturbance of the output buffer circuit 200 may be reduced.

After the pre-charging-discharging period is over (after the time point T4), the level of the fourth control signal CN2 begins to be switched to the second level from the first level for switching on the fourth transistor N2 based on the feedback signal FEED (which is the first control signal CP1 more accurately). After the fourth transistor N2 is switched on, the second output stage circuit 220 provides the second current I2 to the data output terminal OUT, and the voltage level of the data output signal DOUT keeps being pulled down by the second reference voltage VSS until being changed to the first level, thus the state transition is completed.

In short, the first output stage circuit 210 has previously changed the voltage level of the data output terminal OUT during the pre-charging-discharging period. Although the short-circuit current existed between the first transistor P1 and the second transistor N1, the existence time of the short-circuit current is limited. Besides, the current value is limited by the sizes of the transistors of the first output stage circuit 210, and thus, impact of the short-circuit current is limited. For the second output stage circuit 220 which provides the higher current, only one of the third transistor P2 and the fourth transistor N2 may be switched on at the same time, and therefore, short-circuit current cannot be generated. In this way, output disturbance of the data output signal DOUT can be avoided and signal bounce is relieved, so that the requirement for high-speed application of the memory apparatus may still be satisfied.

Figure 5:
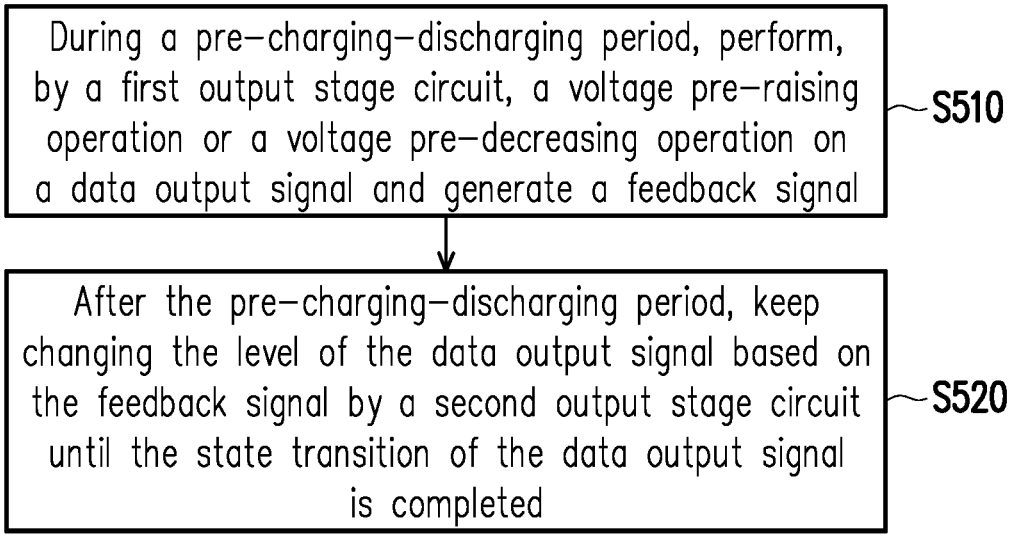
FIG. 5 is a flow chart of a driving method of a buffer output circuit according to an embodiment of the present invention.

FIG. 5 is a flow chart of a driving method of a buffer output circuit according to an embodiment of the present invention. The driving method of the buffer output circuit in FIG. 5 is suitable for embodiments of the memory apparatus or the buffer output circuit in FIG. 1 to FIG. 4. The implementation of the driving method of the buffer output circuit will be described below in combination with element symbols of the foregoing embodiments.

In step S510, during the pre-charging-discharging period, the first output stage circuit 210 performs a voltage pre-raising operation or a voltage pre-decreasing operation on the data output signal DOUT based on the data signal DATA, and the feedback signal FEED is generated. In detail, during the pre-charging-discharging period, at least one transistor of the first output stage circuit 210 is switched on, thus the voltage level of the data output signal DOUT is affected by the first reference voltage VCC or the second reference voltage VSS so as to perform the voltage pre-raising operation or the voltage pre-decreasing operation. For example, the first current I1 is provided to the data output terminal OUT. Then in step S520, after the pre-charging-discharging period is over, the second output stage circuit 220 keeps the level of the data output signal DOUT changing based on the feedback signal FEED until the state transition of the data output signal DOUT is completed. At least one transistor of the second output stage circuit 220 is switched on based on the feedback signal FEED, thus, the voltage level of the data output signal DOUT is affected by the first reference voltage VCC or the second reference voltage VSS, and the second output stage circuit 220 keeps the level of the data output signal DOUT changing until the state transition is completed. For example, the second current I2 is provided to the data output terminal OUT. In this process, the sizes of the transistors of the first output stage circuit 210 may be different from the sizes of the transistors of the second output stage circuit 220, so that the first current I1 is smaller than the second current I2.

In conclusion, according to the buffer output circuit, the memory apparatus and the driving method of the buffer output circuit in the present invention, the logic level of the data output signal is switched in two stages by use of the two output stage circuits, wherein the first output stage circuit performs the voltage pre-raising operation or the voltage pre-decreasing operation on the data output signal by a lower current, then at least one transistor in the second output stage circuit is switched on, and the state transition of the data output signal is completed by a higher current. At least two transistors respectively connected with the first reference voltage and the second reference voltage in the second output stage circuit may be switched on or switched off respectively during and after the pre-charging-discharging period. Therefore, the circumstance that the transistors are switched on at the same time to cause large short-circuit current is avoided. In this way, by the buffer output circuit, the memory apparatus and the driving method of the buffer output circuit in the present invention, output disturbance caused by the short-circuit current and signal bounce during switching of the logic level may be reduced, and meanwhile, the requirement for high-speed output is satisfied.

While the present invention has been disclosed as above in terms of embodiments, it is to be understood that the present invention is not limited thereto. Those of ordinary skill in the art can still make various alterations and modifications without departing from the scope and spirit of the present invention. Therefore, the scope of protection of the present invention shall be defined by the appended claims.

What is claimed is:

1. A buffer output circuit, receiving a data signal to output a data output signal at a data output terminal, comprising:
    a first output stage circuit; and
    a second output stage circuit, coupled to the first output stage to receive a feedback signal,
    wherein the first output stage circuit and the second output stage circuit receive the data signal at the same time and are both coupled to the data output terminal, during a pre-charging-discharging period, the first output stage circuit performs a voltage pre-raising operation or a voltage pre-decreasing operation on the data output signal based on the data signal, and after the pre-charging-discharging period is over, the second output stage circuit keeps the level of the data output signal changing based on the feedback signal until the state transition of the data output signal is completed.

2. The buffer output circuit according to claim 1, wherein the size of at least one transistor of the first output stage circuit is different from the size of at least one transistor of the second output stage circuit.

3. The buffer output circuit according to claim 2, further comprising:
    a load capacitor, having one end coupled to the data output terminal and the other end coupled to ground, wherein a ratio of the size of the at least one transistor of the first output stage circuit to the size of the at least one transistor of the second output stage circuit is decided according to the load capacitor.

4. The buffer output circuit according to claim 1, wherein the first output stage circuit provides a first current to the data output terminal during the pre-charging-discharging period, and the second output stage circuit provides a second current to the data output terminal after the pre-charging-discharging time is over, wherein the second current is greater than the first current.

5. The buffer output circuit according to claim 1, wherein the first output stage circuit comprises:
    a first logic circuit, which outputs the feedback signal according to the data signal, wherein the feedback signal comprises a first control signal and a second control signal;
    a first transistor, having a first end receiving a first reference voltage, a second end coupled to the data output terminal, and a gate terminal coupled to the first logic circuit to receive the first control signal; and
    a second transistor, having a first end coupled to the data output terminal, a second end receiving a second reference voltage, and a gate terminal coupled to the first logic circuit to receive the second control signal,
    wherein one of the first transistor and the second transistor is gradually switched on and the other of the first transistor and the second transistor is gradually switched off during the pre-charging-discharging period.

6. The buffer output circuit according to claim 5, wherein a voltage level of the data output signal is affected by the first reference voltage or the second reference voltage so as to perform the voltage pre-raising operation or the voltage pre-decreasing operation during the pre-charging-discharging period.

7. The buffer output circuit according to claim 5, wherein the first reference voltage is a system high voltage, and the second reference voltage is a system low voltage.

8. The buffer output circuit according to claim 5, wherein the first logic circuit comprises:
    a first NOR gate and a first inverter, wherein the first NOR gate receives an inversion signal of the data signal and an enable signal, an output end of the first NOR gate is coupled to the first inverter, and an output end of the first inverter is coupled to a gate terminal of the first transistor; and
    a first NAND gate and a second inverter, wherein the first NAND gate receives the inversion signal of the data signal and an inversion signal of the enable signal, an output end of the first NAND gate is coupled to the second inverter, and an output end of the second inverter is coupled to a gate terminal of the second transistor.

9. The buffer output circuit according to claim 5, wherein the second output stage circuit comprises:
    a second logic circuit, which is coupled to the first logic circuit, and outputs a third control signal and a fourth control signal according to the data signal and the feedback signal;
    a third transistor, having a first end receiving the first reference voltage, a second end coupled to the data output terminal, and a gate terminal coupled to the second logic circuit to receive the third control signal; and
    a fourth transistor, having a first end coupled to the data output terminal, a second end receiving the second reference voltage, and a gate terminal of the fourth transistor is coupled to the second logic circuit to receive the fourth control signal,
    wherein one of the third transistor and the fourth transistor is switched off during the pre-charging-discharging period, and after the pre-charging-discharging period is over, the other of the third transistor and the fourth transistor begins to be switched on.

10. The buffer output circuit according to claim 9, wherein the second logic circuit comprises:
    a second NOR gate and a third inverter, wherein the second NOR gate receives an inversion signal of the data signal, an enable signal and the second control signal, an output end of the second NOR gate is coupled to the third inverter, and an output end of the third inverter is coupled to a gate terminal of the third transistor; and
    a second NAND gate and a fourth inverter, wherein the second NAND gate receives the inversion signal of the data signal, an inversion signal of the enable signal and the first control signal, an output end of the second NAND gate is coupled to the fourth inverter, and an output end of the fourth inverter is coupled to a gate terminal of the fourth transistor.

11. The buffer output circuit according to claim 9, wherein one of the first transistor and the second transistor is a P-type transistor, the other of the first transistor and the second transistor is an N-type transistor, one of the third transistor and the fourth transistor is a P-type transistor, and the other of the third transistor and the fourth transistor is an N-type transistor.

12. The buffer output circuit according to claim 11, wherein the sizes of the transistors with the same type among the first transistor, the second transistor, the third transistor and the fourth transistor are different.

13. The buffer output circuit according to claim 11, wherein the channel width of the P-type transistor among the first transistor and the second transistor is smaller than the channel width of the P-type transistor among the third transistor and the fourth transistor, and the channel width of the N-type transistor among the first transistor and the second transistor is smaller than the channel width of the N-type transistor among the third transistor and the fourth transistor.

14. The buffer output circuit according to claim 9, wherein a ratio of the channel width of the first transistor or the second transistor to the channel width of the third transistor or the fourth transistor is in a range of ¼ to ⅓.

15. A memory apparatus, comprising:
a memory array; and
at least one buffer output circuit as claimed in claim 1, wherein the at least one buffer output circuit is coupled to the memory array.

16. A driving method of a buffer output circuit, wherein the buffer output circuit receives a data signal to output a data output signal at a data output terminal, and comprises a first output stage circuit and a second output stage circuit, wherein the first output stage circuit and the second output stage circuit receive the data signal at the same time and are both coupled to the data output terminal to change the state of the data output signal based on the data signal, wherein the driving method comprises:
during a pre-charging-discharging period, performing a voltage pre-raising operation or a voltage pre-decreasing operation on the data output signal based on the data signal and generating a feedback signal, wherein at least one transistor of the first output stage circuit is switched on for providing a first current to the data output terminal so as to perform the voltage pre-raising operation or the voltage pre-decreasing operation during the pre-charging-discharging period; and
after the pre-charging-discharging period is over, keeping the level of the data output signal changing based on the feedback signal until the state transition of the data output signal is completed, wherein after the pre-charging-discharging period is over, at least one transistor of the second output stage circuit is switched on based on the feedback signal for providing a second current to the data output terminal, and the second output stage circuit keeps the level of the data output signal changing until the state transition is completed,
wherein the first current and the second current with different magnitudes are provided by the size of the at least one transistor of the first output stage circuit being different from the size of the at least one transistor of the second output stage circuit.

17. The driving method according to claim 16, wherein during the pre-charging-discharging period, the voltage level of the data output signal is pulled up by a system high voltage so as to perform the voltage pre-raising operation, or is pulled down by a system low voltage so as to perform the voltage pre-decreasing operation.

* * * * *